United States Patent
Cheng et al.

(10) Patent No.: US 7,646,440 B2
(45) Date of Patent: Jan. 12, 2010

(54) PIXEL STRUCTURE OF LCD AND FABRICATION METHOD THEREOF

(75) Inventors: Yi-Sheng Cheng, Hsin-Chu (TW); Chih-Wei Chao, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 126 days.

(21) Appl. No.: 12/019,701

(22) Filed: Jan. 25, 2008

(65) Prior Publication Data
US 2008/0225192 A1 Sep. 18, 2008

(30) Foreign Application Priority Data
Mar. 16, 2007 (TW) .............................. 96109220 A

(51) Int. Cl.
*G02F 1/1343* (2006.01)

(52) U.S. Cl. .......................................... 349/39; 349/47
(58) Field of Classification Search ....................... None
See application file for complete search history.

(56) References Cited

U.S. PATENT DOCUMENTS

| 5,734,449 | A | 3/1998 | Jang |
| 6,204,520 | B1 | 3/2001 | Ha et al. |
| 7,196,746 | B2 | 3/2007 | Yang |
| 2001/0052950 | A1* | 12/2001 | Yamazaki et al. ............. 349/43 |

* cited by examiner

*Primary Examiner*—Mike Stahl
(74) *Attorney, Agent, or Firm*—Thomas, Kayden, Horstemeyer & Risley

(57) ABSTRACT

Five photomasks are used in fabricating the pixel structure of an LCD. In this pixel structure, a metal light-shielding layer is formed under the thin film transistor to reduce photocurrent. Furthermore, a metal conductive wire is used to increase the storage capacity of the storage capacitor.

20 Claims, 4 Drawing Sheets

PIXEL STRUCTURE OF LCD AND FABRICATION METHOD THEREOF

RELATED APPLICATIONS

This application claims priority to Taiwan Application Serial Number 96109220, filed Mar. 16, 2007, which is herein incorporated by reference.

BACKGROUND

1. Field of Invention

The present invention relates to a liquid crystal display (LCD) and a fabrication method thereof. More particularly, the present invention relates to pixel structures of an LCD and a fabrication method thereof.

2. Description of Related Art

Liquid crystal displays (LCDs) have many advantages over other conventional displays, including high picture quality, small volume occupation, light weight, low voltage drive and low power consumption. Hence, LCDs are widely used in small portable televisions, mobile telephones, video recording units, notebook computers, desktop monitors, projector televisions and so on. LCDs have gradually replaced the conventional cathode ray tube (CRTs) as the mainstream display units.

The TFT array processes of LCDs mainly include deposition, photolithography and etching. The cost of photolithography is the highest among all these processes. Hence, how to decrease the number of photolithography processes, i.e. decrease the number of required photo masks, is the key factor for reducing LCD production cost.

SUMMARY

According to an embodiment of this invention, a pixel structure of an LCD and a fabrication method thereof are provided.

A first metal layer, a first dielectric layer, and a silicon layer are sequentially formed on a substrate. The first metal layer, the first dielectric layer, and the silicon layer are patterned to define a transistor stack, a data line and a first electrode. The transistor is composed of the first metal layer, the first dielectric layer, and the silicon layer, and the data line and the first electrode are made by the first metal layer. A gate dielectric layer and a second metal layer sequentially formed on the substrate, the transistor stack, the data line and the first electrode. The second metal layer is patterned to define a gate on the transistor stack and a second electrode on the first electrode. The silicon layer is doped to form a first and a second heavily doped regions on two sides of the silicon layer by using the gate as a mask.

A second dielectric layer is formed on the gate dielectric layer, the gate and the second electrode. The second dielectric layer is patterned to form a first, a second, a third and a fourth openings to respectively expose the data line, the first heavily doped region, the second heavily doped region and the first electrode. A third metal layer is formed over the second dielectric layer and then patterned to define a first and a second conductive lines. The first conductive line connects the data line and the first heavily doped region through the first and the second openings, and the second conductive line connects the second heavily doped region and the first electrode through the third and the fourth openings. In addition, the part of the second conductive line overlapping the second electrode, the second electrode, and the first electrode composes a storage capacitor. A transparent conductive layer is formed on the second dielectric layer, the first and the second conducive lines. Then, the transparent conductive layer is patterned to define a pixel electrode on the second conductive line and the second dielectric layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings.

FIGS. 1A-1F are cross-sectional diagrams showing a process for fabricating a pixel array for use in an LCD, according to an embodiment of this invention.

Figure 1A:
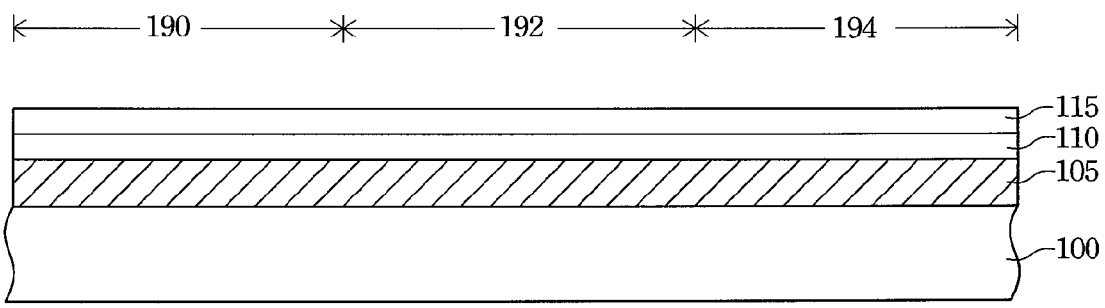
FIGS. 1A-1F are cross-sectional diagrams showing a process for fabricating a pixel array of an LCD, according to an embodiment of this invention.

In FIG. 1A, a first metal layer 105, a first dielectric layer 110 and a silicon layer 115 are sequentially deposited on a substrate 100 having a data line area 190, an active device area 192, and a storage capacitor area 194. The material of the silicon layer 115 is, for example, polysilicon or amorphous silicon. The material of the dielectric layer 110 is, for example, silicon oxide.

Figure 1B:
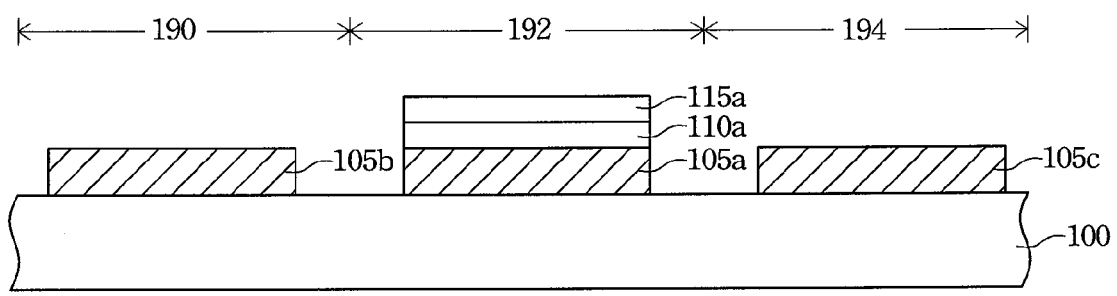

In FIG. 1B, the first metal layer 105, the first dielectric layer 110 and the silicon layer 115 are patterned by, for example, photolithography and etching, and the photolithography is performed by using a halftone photomask. In the data line area 190 and the storage capacitor area 194, the left first metal layers serve as a data line 105b and a first electrode 105c, respectively. In the active device area 192, a transistor stack composed of a metal light-shielding layer 105a, the first dielectric layer 110a and the silicon layer 115a is formed.

Figure 1C:
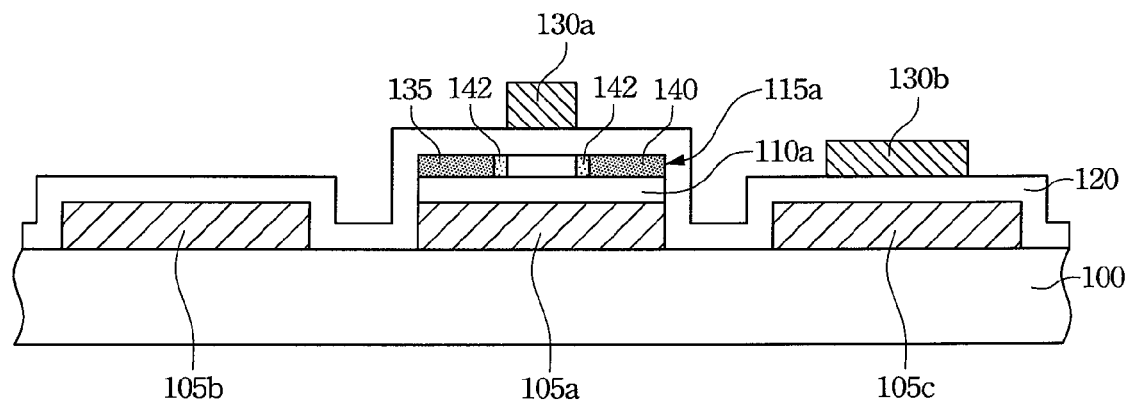

In FIG. 1C, a gate dielectric layer 120 and a second metal layer are sequentially formed on the substrate 100, the data line 105b, the first electrode 105c and the silicon layer 115a. The material of the gate dielectric layer 120 is, for example, silicon oxide, silicon nitride or silicon oxynitride. The second metal layer is then patterned to form a gate 130a above the silicon layer 115a, a second electrode 130b above the first electrode 105c, and a scan line (not shown) connecting the gate 130a. Next, a doping process is performed to dope the silicon layer 115a to form a first heavily doped region and a second heavily doped region serving as source 135 and drain 140. Since the metal light-shielding layer 105a can shield the thin film transistor (TFT), composed of the gate 130a, the source 135 and the drain 140, from the incident light, the photocurrent of the TFT can be reduced.

Optionally, the gate 130a can be further etched. Then, the reduced gate 130a can be a mask for lightly doping the silicon layer 115a to form lightly doped regions 142 between the source 135 and the drain 140.

Figure 1D:
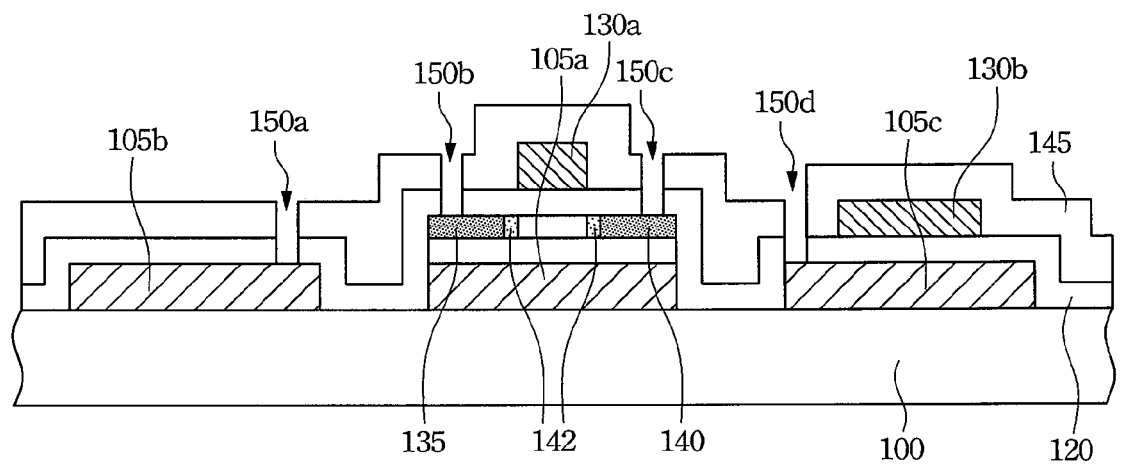

In FIG. 1D, a second dielectric layer 145 is formed on the gate dielectric layer 120, the gate 130a, and the second electrode 130b. The material of the second dielectric layer 145 is, for example, silicon oxide. Then, the second dielectric layer 145 is patterned to form a first opening 150a, a second opening 150b, a third opening 150c, and a fourth opening 150d in the second dielectric layer 145 to expose the data line 105b, the source 135, the drain 140, and the first electrode 105c, respectively.

Figure 1E:
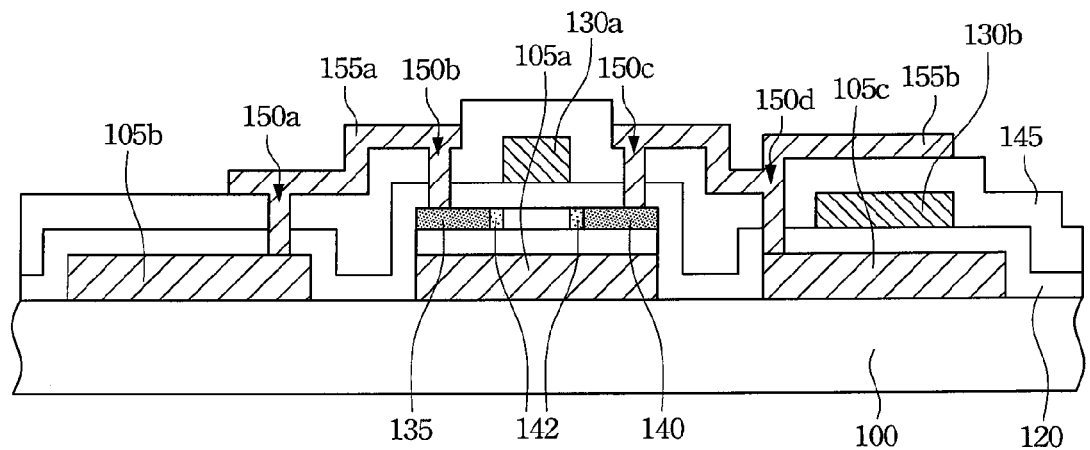

In FIG. 1E, a third metal layer is formed on the second dielectric layer 145 and in the first opening 150a, the second opening 150b, the third opening 150c, and the fourth opening 150d. Next, the third metal layer is patterned to form a first conductive line 155a, connecting the source 135 and the data line 105b, and a second conductive line 155b, connecting the drain 140 and the first electrode 105c.

The first electrode 105c, the second electrode 130b, and the second conductive line 155b overlapping the second electrode 130b compose a storage capacitor to greatly increase the storage capacity of the storage capacitor, wherein the second conductive line 155b electrically connects the first electrode 105c.

Figure 1F:
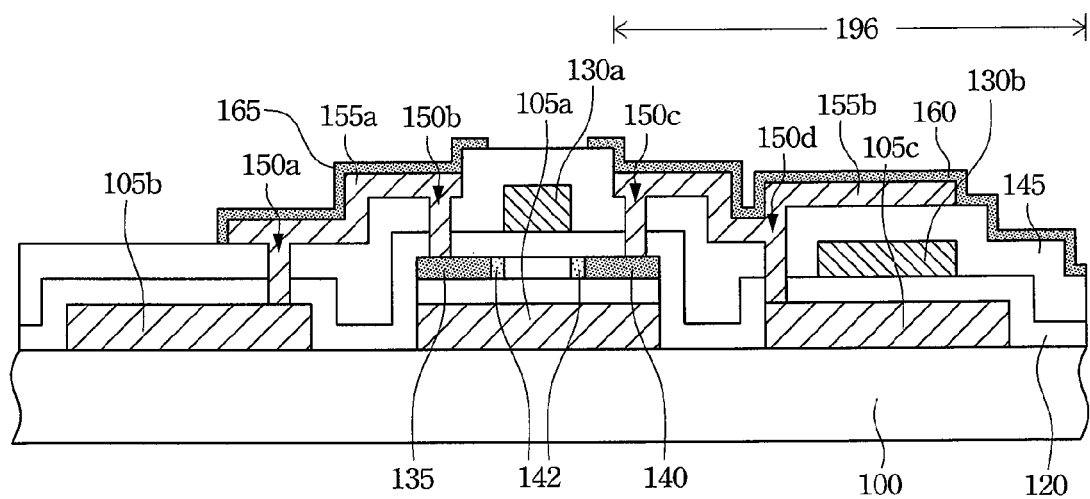

In FIG. 1F, a transparent conductive layer is formed on the second dielectric layer 145, the first conductive line 155a, and the second conductive line 155b. The material of the transparent conductive layer is, for example, indium tin oxide, indium zinc oxide, or aluminum zinc oxide. The transparent conductive layer is then patterned to form pixel electrode 160 in a pixel area 196, which is overlapped with the storage capacitor area 194, and a protective layer 165 on the first conductive line 155a to prevent oxidation of the first conductive line 155a.

Figure 2:
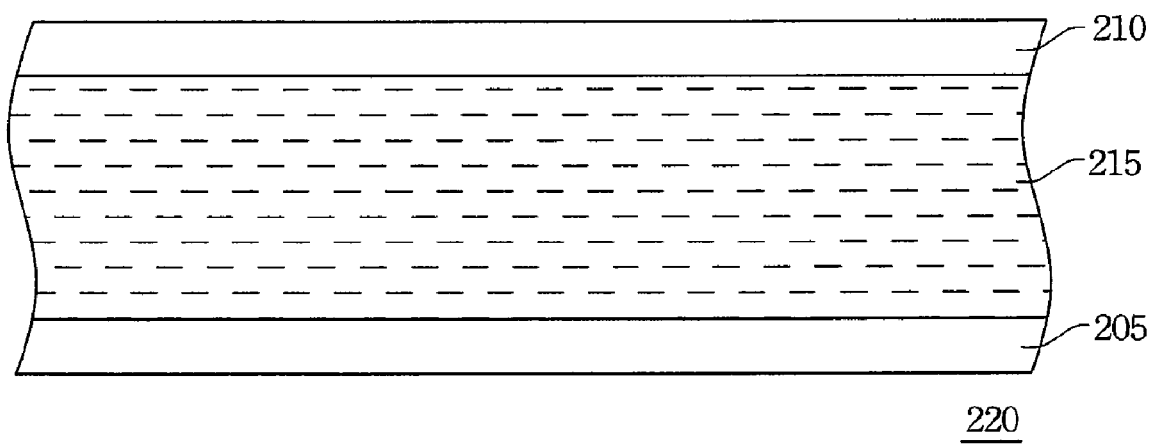
FIG. 2 is a cross-sectional diagram showing an LCD.

The pixel array structure can be applied on any suitable flat display panels, such as an LCD. FIG. 2 is a cross-sectional diagram showing an LCD. In FIG. 2, an LCD 220 has a first substrate 205, a second substrate 210 and a liquid crystal layer 215 therebetween. If the pixel array structure is formed on the first substrate 205, a color filter array structure can be formed on the second substrate 210. Since variations of LCD structures are well known by persons skilled in the art, the detail structure of the LCD 220 is not shown in FIG. 2.

Accordingly, only five photomasks are required in fabricating the whole pixel array structure. Moreover, according to FIG. 1F, the storage capacitor is composed of the first electrode 105c, the second electrode 130b, and the second conductive line 155b. Furthermore, the metal light-shielding layer 105a can shield TFT from incident light to reduce photocurrent of the TFT.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of fabricating pixel structure, comprising:
    sequentially forming a first metal layer, a first dielectric layer, and a silicon layer on a substrate;
    patterning the first metal layer, the first dielectric layer, and the silicon layer to define a transistor stack, a data line and a first electrode, wherein the transistor comprises the first metal layer, the first dielectric layer, and the silicon layer, and the data line and the first electrode are made by the first metal layer;
    sequentially forming a gate dielectric layer and a second metal layer on the substrate, the transistor stack, the data line and the first electrode;
    patterning the second metal layer to define a gate on the transistor stack and a second electrode on the first electrode;
    doping the silicon layer to form a first and a second heavily doped regions on two sides of the silicon layer by using the gate as a mask;
    forming a second dielectric layer on the gate dielectric layer, the gate and the second electrode;
    patterning the second dielectric layer to form a first, a second, a third and a fourth openings to respectively expose the data line, the first heavily doped region, the second heavily doped region and the first electrode;
    forming a third metal layer over the second dielectric layer;
    patterning the third metal layer to define a first and a second conductive lines, wherein the first conductive line connects the data line and the first heavily doped region through the first and the second openings, the second conductive line connects the second heavily doped region and the first electrode through the third and the fourth openings, and a part of the second conductive line overlaps the second electrode, wherein the part of the second conductive line, the second electrode, and the first electrode compose a storage capacitor;
    forming a transparent conductive layer on the second dielectric layer, the first and the second conductive lines; and
    patterning the transparent conductive layer to define a pixel electrode on the second conductive line and the second dielectric layer.

2. The method of claim 1, wherein the silicon layer is a polysilicon layer or an amorphous silicon layer.

3. The method of claim 1, wherein a material of the first and the second dielectric layer comprises silicon oxide.

4. The method of claim 1, wherein a material of the gate dielectric layer is silicon oxide, silicon nitride, or silicon oxynitride.

5. The method of claim 1, wherein a material of the transparent conductive layer is indium tin oxide, indium zinc oxide, or aluminum zinc oxide.

6. The method of claim 1, further comprising the following steps between the doping step and forming the second dielectric step:
    etching the gate to reduce the size of the gate; and
    doping the silicon layer to form lightly doped regions between the first and the second heavily doped regions.

7. The method of claim 1, further comprising forming a scan line to electrically connect to the gate in the step of patterning the second metal layer.

8. A pixel structure applied in an LCD, comprises:
    a transistor stack, comprising a metal light-shielding layer, a first dielectric layer and a silicon layer from bottom to top, located on a substrate having an active device area, wherein the silicon layer has a first and a second heavily doped region on both sides;
    a data line on the substrate having a data line area;
    a first electrode on the substrate having a storage capacitor area;
    a gate dielectric layer over the substrate, the transistor stack, the data line, and the first electrode;
    a gate on the gate dielectric layer over the transistor stack;
    a second electrode on the gate dielectric layer over the first electrode;
    a second dielectric layer over the gate dielectric layer, the gate and the second electrode, the second dielectric layer having a first, a second, a third and a fourth openings to respectively expose the data line, the first heavily doped region, the second heavily doped region and the first electrode;

a first conductive line in the first and the second openings and on the second dielectric layer to connect the data line and the first heavily doped region;

a second conductive line in the third and the fourth openings and on the second dielectric layer to connect the second heavily doped region and the first electrode, a part of the second conductive line overlapping the second electrode together with the second electrode and the first electrode compose a storage capacitor; and a pixel electrode, connected to the second conductive line, in a pixel area.

9. The pixel structure of claim 8, wherein the metal light-shielding layer, the data line and the first electrode are made by a first metal layer, the gate and the second electrode are made by a second metal layer, and the first and the second conductive lines are made by a third metal layer.

10. The pixel structure of claim 9, further comprising a scan line, made by the second metal layer, electrically connected to the gate.

11. The pixel structure of claim 8, wherein a material of the silicon layer is polysilicon or amorphous silicon.

12. The pixel structure of claim 8, wherein a material of the first and the second dielectric layers comprises silicon oxide.

13. The pixel structure of claim 8, wherein a material of the gate dielectric layer is silicon oxide, silicon nitride, or silicon oxynitride.

14. The pixel structure of claim 8, wherein a material of the pixel electrode is indium tin oxide, indium zinc oxide, or aluminum zinc oxide.

15. The pixel structure of claim 8, further comprising a protective layer on the first conductive line.

16. The pixel structure of claim 15, wherein a material of the protective layer is indium tin oxide, indium zinc oxide, or aluminum zinc oxide.

17. A liquid crystal display, comprises:
a pixel array plate having at least a pixel structure thereon;
a color filter plate; and
a liquid crystal layer between the pixel array plate and the color filter plate;
wherein the pixel structure comprises:

a transistor stack, composed of a metal light-shielding layer, a first dielectric layer and a silicon layer from bottom to top, located in an active device area, wherein the silicon layer has a first and a second heavily doped region on both sides;

a data line in a data line area;

a first electrode in a storage capacitor area;

a gate dielectric layer over the substrate, the transistor stack, the data line, and the first electrode;

a gate on the gate dielectric layer over the transistor stack;

a second electrode on the gate dielectric layer over the first electrode;

a second dielectric layer over the gate dielectric layer, the gate and the second electrode, the second dielectric layer having a first, a second, a third and a fourth openings to respectively expose the data line, the first heavily doped region, the second heavily doped region and the first electrode;

a first conductive line in the first and the second openings and on the second dielectric layer to connect the data line and the first heavily doped region;

a second conductive line in the third and the fourth openings and on the second dielectric layer to connect the second heavily doped region and the first electrode, a part of the second conductive line overlapping the second electrode together with the second electrode and the first electrode compose a storage capacitor; and a pixel electrode, connected to the second conductive line, in a pixel area.

18. The liquid crystal display of claim 17, wherein the metal light-shielding layer, the data line and the first electrode are made by a first metal layer, the gate and the second electrode are made by a second metal layer, and the first and the second conductive lines are made by a third metal layer.

19. The liquid crystal display of claim 17, further comprising a scan line, made by the second metal layer, electrically connected to the gate.

20. The liquid crystal display of claim 17, further comprising a protective layer on the first conductive line.

* * * * *